(12) United States Patent
Pierrat et al.

(10) Patent No.: US 7,629,109 B2
(45) Date of Patent: Dec. 8, 2009

(54) EXPOSURE CONTROL FOR PHASE SHIFTING PHOTOLITHOGRAPHIC MASKS

(75) Inventors: Christophe Pierrat, Santa Clara, CA (US); Michel Luc Cote, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/080,886

(22) Filed: Apr. 7, 2008

(65) Prior Publication Data

US 2008/0187869 A1   Aug. 7, 2008

Related U.S. Application Data

(63) Continuation of application No. 10/841,276, filed on May 7, 2004, now Pat. No. 7,422,841, which is a continuation of application No. 09/972,428, filed on Oct. 5, 2001, now Pat. No. 6,852,471.

(60) Provisional application No. 60/296,788, filed on Jun. 8, 2001, provisional application No. 60/304,142, filed on Jul. 10, 2001.

(51) Int. Cl.
G03F 7/20 (2006.01)
(52) U.S. Cl. .............................. 430/311; 430/394
(58) Field of Classification Search .................. 430/311
See application file for complete search history.

(56) References Cited

U.S. PATENT DOCUMENTS

| 4,037,918 A | 7/1977 | Kato et al. |
| 4,456,371 A | 6/1984 | Lin |
| 5,302,477 A | 4/1994 | Dao et al. |
| 5,308,741 A | 5/1994 | Kemp |
| 5,316,878 A | 5/1994 | Saito et al. |
| 5,324,600 A | 6/1994 | Jinbo et al. |
| 5,328,807 A | 7/1994 | Tanaka et al. |

(Continued)

FOREIGN PATENT DOCUMENTS

EP   1 152 289 A2   11/2001

(Continued)

OTHER PUBLICATIONS

Jinbo, H. et al., "0.2 um or Less Lithography by Phase-Shifting-Mask Technology", 1990, IEEE, pp. 33.3.1-33.3.4 [see instant Parent U.S. Appl. No. 09/972,428 IDS Mar. 15, 2002].*

(Continued)

*Primary Examiner*—Mark F Huff
*Assistant Examiner*—John Ruggles
(74) *Attorney, Agent, or Firm*—Kenta Suzue; Haynes Beffel & Wolfeld LLP

(57) ABSTRACT

Mask and integrated circuit fabrication approaches are described to facilitate use of so called "full phase" masks. This facilitates use of masks where substantially all of a layout is defined using phase shifting. In one embodiment, the phase shifting mask and the trim mask are exposed using substantially the same exposure conditions. These approaches facilitate better exposure profiles for the resulting ICs and can thus improve chip yield and increase throughput by reducing the need to alter settings and/or switch reticles between exposures.

30 Claims, 6 Drawing Sheets
(1 of 6 Drawing Sheet(s) Filed in Color)

U.S. PATENT DOCUMENTS

| | | | |
|---|---|---|---|
| 5,334,542 | A | 8/1994 | Saito et al. |
| 5,352,550 | A | 10/1994 | Okamoto et al. |
| 5,364,716 | A | 11/1994 | Nakagawa et al. |
| 5,424,154 | A | 6/1995 | Borodovsky |
| 5,472,814 | A | 12/1995 | Lin |
| 5,480,746 | A | 1/1996 | Jinbo et al. |
| 5,496,666 | A | 3/1996 | Chu et al. |
| 5,498,579 | A | 3/1996 | Borodovsky et al. |
| 5,503,951 | A | 4/1996 | Flanders et al. |
| 5,523,186 | A | 6/1996 | Lin et al. |
| 5,527,645 | A | 6/1996 | Pati et al. |
| 5,532,090 | A | 7/1996 | Borodovsky |
| 5,537,648 | A | 7/1996 | Liebmann et al. |
| 5,538,815 | A | 7/1996 | Oi et al. |
| 5,539,568 | A | 7/1996 | Lin et al. |
| 5,565,286 | A | 10/1996 | Lin |
| 5,573,890 | A | 11/1996 | Spence |
| 5,595,843 | A | 1/1997 | Dao |
| 5,620,816 | A | 4/1997 | Dao |
| 5,635,316 | A | 6/1997 | Dao |
| 5,636,131 | A | 6/1997 | Liebmann et al. |
| 5,702,848 | A | 12/1997 | Spence |
| 5,725,969 | A | 3/1998 | Lee |
| 5,761,075 | A | 6/1998 | Oi et al. |
| 5,766,804 | A | 6/1998 | Spence |
| 5,766,806 | A | 6/1998 | Spence |
| 5,807,649 | A | 9/1998 | Liebmann et al. |
| 5,811,211 | A | 9/1998 | Tanaka et al. |
| 5,827,623 | A | 10/1998 | Ishida et al. |
| 5,858,580 | A | 1/1999 | Wang et al. |
| 5,885,734 | A | 3/1999 | Pierrat et al. |
| 5,923,562 | A | 7/1999 | Liebmann et al. |
| 5,923,566 | A | 7/1999 | Galan et al. |
| 6,040,892 | A * | 3/2000 | Pierrat ............... 355/53 |
| 6,083,275 | A | 7/2000 | Heng et al. |
| 6,130,012 | A | 10/2000 | May et al. |
| 6,139,994 | A | 10/2000 | Broeke et al. |
| 6,185,727 | B1 | 2/2001 | Liebmann |
| 6,228,539 | B1 | 5/2001 | Wang et al. |
| 6,251,549 | B1 | 6/2001 | Levenson |
| 6,258,493 | B1 | 7/2001 | Wang et al. |
| 6,335,128 | B1 | 1/2002 | Cobb et al. |
| 6,338,922 | B1 | 1/2002 | Liebmann et al. |
| 6,351,304 | B1 | 2/2002 | Kawashima et al. |
| 6,391,501 | B1 | 5/2002 | Ohnuma et al. |
| 6,420,074 | B2 | 7/2002 | Wang et al. |
| 6,436,590 | B2 | 8/2002 | Wang et al. |
| 6,518,180 | B1 | 2/2003 | Fukuda et al. |
| 6,537,867 | B1 | 3/2003 | Freyman et al. |
| 6,628,372 | B2 | 9/2003 | McCullough et al. |
| 6,852,471 | B2 | 2/2005 | Pierrat et al. |
| 7,422,841 | B2 * | 9/2008 | Pierrat et al. ............... 430/311 |
| 2001/0000240 | A1 | 4/2001 | Wang et al. |
| 2001/0028985 | A1 | 10/2001 | Wang et al. |
| 2001/0036604 | A1 | 11/2001 | Kawashima |
| 2002/0083410 | A1 | 6/2002 | Wu et al. |
| 2002/0122994 | A1 | 9/2002 | Cote et al. |
| 2002/0127479 | A1 | 9/2002 | Pierrat |
| 2002/0129327 | A1 | 9/2002 | Pierrat et al. |
| 2002/0136964 | A1 | 9/2002 | Pierrat |
| 2002/0142231 | A1 | 10/2002 | Kling et al. |
| 2002/0142232 | A1 | 10/2002 | Kling et al. |
| 2002/0144232 | A1 | 10/2002 | Ma et al. |
| 2002/0152454 | A1 | 10/2002 | Cote et al. |
| 2002/0155363 | A1 | 10/2002 | Cote et al. |

FOREIGN PATENT DOCUMENTS

| | | |
|---|---|---|
| JP | 04-186244 | 7/1992 |
| JP | 5-275303 | 10/1993 |
| JP | 10326007 | 12/1998 |
| JP | 11212247 | 8/1999 |
| JP | 2000-258892 | 9/2000 |
| JP | 2000-349011 | 12/2000 |
| WO | 99/09456 | 2/1999 |
| WO | 0025181 | 5/2000 |

OTHER PUBLICATIONS

Wong, Alexander S. et al., "Investigating Phase-Shifting Mask Layout Issues Using a CAD Toolkit", 1991, IEEE, pp. 27.4.1-27.4.44 [see instant Parent U.S. Appl. No. 09/972,428 IDS Aug. 1, 2002].*

Kikuchi, Kohji et al., "Method of Expanding Process Window for the Double Exposure Technique With alt-PSMs", 2000, Proceedings of SPIE vol. 4000, pp. 121-131 [see instant $2^{nd}$ CON, $2^{nd}$ IDS Sep. 5, 2008 NPL 1 of 1].*

K. Kikuchi "Method of Expanding Process Window for the Double Exposure Technique with Alt-PSMs" Folia Biologica Mar. 1, 2008, Processing of SPIE v. 4000 pp. 121-131.

Japanese Office Action dated Jun. 16, 2008 from a corresponding Japanese Application No. 2003-504165.

Japanese Office Action dated Jun. 30, 2008 from a corresponding Japanese Application No. 2003-504163.

Japanese Office Action dated Apr. 14, 2008 from corresponding Japanese App. No. 2003-504166.

Wong, Alfred K., "Polarization Effects in Mask Transmission," Proc. of SPIE 1674, Mar. 8, 1992, 8 pages. cited by other.

Ackmann, Paul, et al., "Phase Shifting and Optical Proximity Corrections to improve CD control on Logic Devices in Manufacturing for sub 0.35 .mu.m I-Line," Proc. of SPIE 3051-07, Mar. 1997, 8 pages. cited by other.

Spence, C., et al., "Detection of 60 degree Phase defects on Alternating PSMs," Proc. of SPIE 3412-73, Apr. 1998, 2 pages. cited by other.

Sugawara, Minoru, et al., "Defect printability study of attenuated phase-shifting masks for specifying inspection sensitivity," Proc. SPIE 2621-49, Sep. 1995, 16 pages. cited by other.

Schmidt, Regina, et al., "Impact of Coma on CD Control for Multiphase PSM Designs," Proc. SPIE 3334-02, Feb. 1998, 11 pages. cited by other.

Erdmann, Andreas, "Topography effects and wave aberrations in advanced PSM-technology," Proc. SPIE 4346-36, Mar. 1, 2001, 28 pages. cited by other.

Granik, Yuri et al., "CD variation analysis technique and its application to the study of PSM mask misalignment," Proc. SPIE 4186-94, Sep. 2000, 9 pages. cited by other.

Ishiwata, Naoyuki, et al., "Fabrication of Phase-Shifting Mask," Proc. SPIE 1463, Mar. 1991, 11 pages. cited by other.

Levenson, Marc D., et al., "Phase Phirst! An improved strong-PSM paradigm," Proc. SPIE 4186-42, Sep. 2000, 10 pages. cited by other.

Levenson, Marc. D., et al., "SCAA mask exposures and Phase Phirst design for 110nm and below," Proc. SPIE 4346-817, Sep. 2001, 10 pages. cited by other.

Morikawa, Yasutaka, et al., "100nm-Alt PSM structure discussion for ArF lithography," Proc. SPIE 4409-22, Apr. 2001, 15 pages. cited by other.

Ozaki, T., et al., "A 0.15.mu.m KrF Lithography for 1Gb DRAM Product using Highly Printable Patterns and Thin Resist Process," 1998 Symposium on VLSI Technology, Jun. 1998, Honolulu, Hawaii, 2 pages. cited by other.

Ronse, Kurt, et al., "Comparison of various phase shift strategies and application to 0.35 .mu.m ASIC designs," Proc. SPIE 1927, 1993, 15 pages. cited by other.

Rosenbluth, Alan E., et al., "Optimum Mask and Source Patterns to Print a Given Shape," Proc. SPIE 4346-49, Mar. 1, 2001, 17 pages. cited by other.

Suzuki, Akiyoshi, et al., "Multilevel imaging system realizing k1-0.3 lithography," Proc. SPIE 3679-36, Mar. 1999, 13 pages. cited by other.

Vandenberghe, G., et al., "(Sub-) 100nm gate patterning using 248nm alternating PSM," Mentor Graphics White Paper, May 2001, 9 pages. cited by other.

Fritze, M., et al., "100-nm Node Lithography With KrF?" Feb. 1, 2001, 14 pages. cited by other.

Fukuda, Hiroshi, et al., "Patterning of Random Interconnect Using Double Exposure of Strong-Type PSMs," Proc. SPIE 4346-695, Sep. 2001, 8 pages. cited by other.

Ferguson, Richard A., et al., "Pattern-Dependent Correction of Mask Topography Effects for Alternating Phase-Shifting Masks," Proc. SPIE 2440-349, May 1995, 12 pages. cited by other.

Toublan, Olivier, et al., "Phase and Transmission Errors Aware OPC Solution for PSM: Feasibility Demonstration," Proc. SPIE 4186-95, Sep. 13, 2000, 7 pages. cited by other.

Yanagishita, Yuichiro, et al., "Phase-Shifting Photolithography Applicable to Real IC Patterns," Proc. SPIE 1463, Mar. 3, 1991, 11 pages. cited by other.

Pierrat, C., "Investigation of Proximity Effects in Alternating Aperture Phase Shifting Masks," Sep. 2000, 11 pages. cited by other.

Cote, Michel, et al., "A Pratical Application of Full-Feature Alternating Phase-Shifting Technology for a Phase-Aware Standard-Cell Design Flow," Jun. 1, 2001, 6 pages. cited by other.

Hanyu, Isamu, et al., "New phase-shifting mask with highly transparent SiOZ phase shifters," Proc. SPIE 1264-167, Jun. 1990, pp. 166-177. cited by other.

McCallum, Martin, et al., "Alternating PSM Mask Performance—A Study of Multiple Fabrication Technique Results," Proc. SPIE 4346-723, Sep. 2001, 6 pages. cited by other.

IBM, "Phase-Shift Mask Utilizing Silicon Oxy-Nitride as a Low Reflectivity Phase-Shift Layer", IBM Technical Disclosure Bulletin, vol. 34, No. 10B, pp. 360-361, Mar. 1992. cited by other.

Brunner, T., et al., "170nm Gates Fabricated by Phase-Shift Mask and Top Anti-Reflector Process", SPIE, Optical/Laser Microlithography VI, Vo. 1927, pp. 182-189 (1993). cited by other.

Brunner, T., "Rim Phase-Shift Mask Combined with Off-Axis Illumination: A Path to 0.5(lampda) / Numerical Aperture Geometries", Optical Engineering, vol. 32, No. 10, pp. 2337-2343, Oct. 1993. cited by other.

Lin, B.J., "Phase-Shifting Masks Gain an Edge", IEEE Circuits & Devices, pp. 28-35, Mar. 1993. cited by other.

Lin, H.Y., et al., "Fabrication of 0.1.mu.m T-Shaped Gates by Phase-Shifting Optical Lithography", SPIE, Optical/Laser Microlithography VI, vol. 1927, pp. 42-52 (1993). cited by other.

Nistler, J., et al., "Phase Shift Mask Defect Printability Analysis", Proceedings Of The Microlithography Seminar Interface '93, OCG Microelectronic Materials, Inc., pp. 11-28 (1993). cited by other.

Rieger, M., et al., "System for Lithography Proximity Compensation", Precim Company, Portland, Oregon, Sep. 1993 (28 pages). cited by other.

Troccolo, P., et al., "Interferometric Measurement of Etch Depths in Phase Shift Masks", BACUS News, vol. 9, Issue 6, pp. 1 & 4-6, Jun. 1993. cited by other.

Watanabe, H., et al., "Phase-Shifting Lithography: Masks making and its Application", J. Vac. Sci. Technol. B, vol. 11, No. 6, pp. 2669-2674, Nov./Dec. 1993. cited by other.

Galan, G., et al., "Application of Alternating-Type Phase Shift Mask to Polysilicon Level for Random Logic Circuits", Jpn. J. Appl. Phys. vol. 33, pp. 6779-6784 (1994). cited by other.

Mizuno, F., et al., "Practical Phase-Shifting Mask Technology for 0.3.mu.m Large Scale Integrations", J Vac. Sci. Technol. B, vol. 12, No. 6, pp. 3799-3803, Nov./Dec. 1994. cited by other.

Nistler, J., et al., "Large Area Optical Design Rule Checker for Logic PSM Application", SPIE, Photomask And X-Ray Mask Technology, vol. 2254, pp. 78-92 (1994). cited by other.

Pati, Y.C., et al., "Phase-Shifting Masks for Microlithography: Automated Design and Mask Requirements", J. Opt. Soc. Am., vol. 11, No. 9, pp. 2438-2452, Sep. 1994. cited by other.

Pierrat, C., et al., "A Rule-Based Approach to E-Beam and Process-Induced Proximity Effect Correction for Phase-Shifting Mask Fabrication", SPIE, vol. 2194, pp. 298-309 (1994). cited by other.

Spence, C., et al., "Automated Determination of CAD Layout Failures Through Focus: Experiment and Simulation", SPIE, vol. 2197, pp. 302-313 (1994). cited by other.

Stimiman, J., et al., "Wafer Proximity Correction and Its Impact on Mask-Making", Bacus News, vol. 10, Issue 1, pp. 1, 3-7, 10-12, Jan. 1994. cited by other.

Waas, T., et al., "Automatic Generation of Phase Shift Mask Layouts", Microelectronic Engineering, vol. 23, pp. 139-142 (1994). cited by other.

Barouch, E., et al., "Optimask: An OPC Algorithm for Chrome and Phase-Shift Mask Design", SPIE, Vo. 2440, pp. 192-206, Feb. 1995. cited by other.

Karklin, L., "A Comprehensive Simulation Study of the Photomask Defects Printability", SPIE, vol. 2621, pp. 490-504 (1995). cited by other.

Langston, J., et al., "Extending Optical Lithography to 0.25.mu.m and Below", Solid State Technology, pp. 57-64, Mar. 1995. cited by other.

Nagahiro, Y., "Improved Mask Technique for Photolithography Applied to 0.25.mu.m LSI—Improvement of Resolution Pattern Correction, Exposure Area", Nikkei Microdevices, pp. 1-6, Apr. 1995. cited by other.

Okamoto, Y., et al., "A New Phase Shifting Mask Technology for Quarter Micron Photolithography", SPIE, vol. 251, pp. 311-318 (1995). cited by other.

Pierrat, C., et al., "Required Optical Characteristics of Materials for Phase-Shifting Masks", Applied Optics, vol. 34, No. 22, pp. 4923-4928, Aug. 1, 1995. cited by other.

Galan, G., et al., "Alternating Phase Shift Generation for Coplex Circuit Designs", SPIE, vol. 2884, pp. 508-519, Sep. 18-20, 1996. cited by other.

Kanai, H., et al., "Sub-Quarter Micron Lithography with the Dual-Trench Type Alternating PSM", SPIE, vol. 2793, pp. 165-173 (1996). cited by other.

Ishiwara, N., et al., "Novel Alternating Phase Shift Mask with Improved Phase Accuracy", SPIE, Proceedings Of The 17th Annual Symposium On Photomask Technology And Management, vol. 3236, pp. 243-249 (1997). cited by other.

Morimoto, H., et al., "Next Generation Mask Strategy—Technologies are Ready for Mass Production of 256MDRAM?", SPIE, vol. 3236, pp. 188-189 (1997). cited by other.

Roman, B., et al., "Implications of Device Processing on Photomask CD Requirements", SPIE, vol. 3236 (1997) (Abstract Only). cited by other.

Ishida, S., et al., "Large Assist Feature Phase-Shift Mask for Sub-Quarter Micrometer Window Pattern Formation", SPIE, vol. 3096, pp. 333-343 (1997). cited by other.

Nakae, A., et al., "A Proposal for Pattern Layout Rule In Application of Alternating Phase Shift Mask", SPIE, vol. 3096, pp. 362-374 (1997). cited by other.

Tsujimoto, E., et al., "Hierarchical Mask Data Design System (Prophet) for Aerial Image Simulation, Automatic Phase-Shifter Placement, and Subpeak Overlap Checking", SPIE, vol. 3096, pp. 163-172 (1997). cited by other.

Yamamoto, K., et al., "Hiearchical Processing of Levenson-Type Phase Shifter Generation", Jpn. J. Appl. Phys., vol. 36, Part I, No. 12B, pp. 7499-7503, Dec. 1997. cited by other.

Gordon, R., et al., "Design and Analysis of Manufacturable Alternating Phase-Shifting Masks", Bacus News, vol. 14, Issue 12, pp. 1-9, Dec. 1998. cited by other.

Nara, M., et al., "Phase Controllability Improvement for Alternating Phase Shift Mask", Dai Nippon Printing Co., Ltd. (16 pages). cited by other.

Petersen, J., et al., "Designing Dual-Trench Alternating Phase-Shift Masks for 140nm and Smaller Features Using 248-nm KrF and Pattern ArF Lithography", Bacus News, vol. 14, Issue 8, pp. 1 & 4-13, Aug. 1998. cited by other.

Fukuda, H., et al., "Determination of High-Order Lens Aberration Using Phase/Amplitude Linear Algebra", J. Vac. Sci. Technol. B, vol. 17, No. 6, pp. 3318-3321, Nov./Dec. 1999. cited by other.

Fukuda, H., "Node-Connection/Quantum Phase-Shifting Mask: Path to Below 0.3.mu.m Pitch, Proximity Effect Free, Random Interconnects and Memory Patterning" J. Vac. Sci. Technol. B, vol. 17, No. 6, pp. 3291-3295, Nov./Dec. 1999. cited by other.

Spence, C., et al., "Integration of Optical Proximity Correction Strategies in Strong Phase Shifters Design for Poly-Gate Layers", Bacus News, vol. 15, Issue 12, pp. 1, 4-13. Dec. 1999. cited by other.

Kuo, C., et al., "Extension of Deep-Ultraviolet Lithography for Patterning Logic Gates Using Alternating Phase Shifting Masks", J. Vac. Sci. Technol. B, vol. 17, No. 6, pp. 3296-3300, Nov./Dec. 1999. cited by other.

Palmer, S, et al., "Dual Mask Model-Based Proximity Correction for High Performance 0.10.mu.m CMOS Process", The 44th International Conference on Electron, Ion and Photon Beam Technology and Nanofabrication Abstracts, pp. 18-19, May 30-Jun. 2, 2002.cited by other.

Heng, F., et al., "Application of Automated Design Migration to Alternating Phase Sifht Mask Design", IBM Research Report KC 21978 (98769), Feb. 26, 2001 (7 pages). cited by other.

Wong, A., et al., "Alternating Phase-Shift Mask with Reduced Aberration Sensitivity: Lithography Considerations", Proc. SPIE, vol. 4346, pp. 1-9 (2001). cited by other.

Sakata, Miwa, et al., "A Novel Radiation Sensitive Spin-on-glass Convertible into SiO2 and the Simple Fabrication Process Using It," Jul. 26, 1993 (ATI Bell Labs fax date), 3 pages. cited by other.

Pistor, Thomas V., "Rigorous 3D Simulation of Phase Defects in Alternating Phase-Shifting Masks," Proceedings of SPIE 4562-1038 (Mar. 2002), 13 pages. cited by other.

Ogawa, Kiyoshi, et al., "Phase Defect Inspection by Differential Interference," Proceedings of SPIE 4409-71, Apr. 26, 2001, 12 pages. cited by other.

Rhyins, P., et al., "Characterization of Quartz Etched PSM Masks for KrF Lithography at the 100 nm node," Proceedings of SPIE 4562 (Mar. 2002), 486-495. cited by other.

Sewell, Harry, et al., "An Evaluation of the Dual Exposure Technique," (As early as 2002), 11 pages The date is based on references 8&9 of the article of Feb. 16, 2001 and Feb. 27, 2002, respectively. cited by other.

Wang, Ruoping, et al., "Polarized Phase Shift Mask: Concept, Design, and Potential Advantages to Photolithography Process and Physical Design," Proceedings of SPIE 4754-105, Apr. 25, 2002, 12 pages. cited by other.

Matsuoka, et al., "Application of Alternating Phase-Shifting Mask to 0.16.mu.m CMOS Logic Gate Patterns," SPIE Proc. 3051, Mar. 10-14, 1997, 10 pages. cited by other.

Semmier, Armin, et al., "Application of 3D EMF Simulation for Development and Optimization of Alternating Phase Shifting Masks," Proc. of SPIE 4346-37, Mar. 1, 2001, 12 pages. cited by other.

European Office Action dated Apr. 7, 2009 from corresponding European application No. 02737445.3.

Ohnuma et al. "Automatic Phase Shift Mask CAD Layout Tool for Gate Shrinkage of Embedded DRAM in Logic Below 0.18 um," Proceedings of the SPIE Conference on Photomask and X-Ray Mask Technology V, vol. 3412, 1998, pp. 206-213.

Japanese Office Action dated Feb. 9, 2009 from corresponding Japanese Application No. 2003-504164.

* cited by examiner

After 1st Exposure 1000

After 2nd Exposure 1100

After 3rd Exposure 1200

EXPOSURE CONTROL FOR PHASE SHIFTING PHOTOLITHOGRAPHIC MASKS

RELATED APPLICATIONS

This application is a continuation of U.S. patent application Ser. No. 10/841,276 filed on 7 May 2004, now U.S. Pat. No. 7,422,841 issued 9 Sep. 2008, which is a continuation of U.S. patent application Ser. No. 09/972,428 filed on 5 Oct. 2001, now U.S. Pat. No. 6,852,471 issued 8 Feb. 2005, which is related to, claims the benefit of priority of, and incorporates by reference, the U.S. Provisional Patent Application Ser. No. 60/296,788 filed 8 Jun. 2001 entitled "Phase Conflict Resolution for Photolithographic Masks" having inventors Christophe Pierrat and Michel Côté and assigned to the assignee of the present invention, and which application is related to, claims the benefit of priority of, and incorporates by reference, the U.S. Provisional Patent Application Ser. No. 60/304, 142 filed 10 Jul. 2001 entitled "Phase Conflict Resolution for Photolithographic Masks" having inventors Christophe Pierrat and Michel Côté and assigned to the assignee of the present invention.

BACKGROUND OF THE INVENTION

1. Field of the Invention

The present invention relates to manufacturing small dimension features of objects, such as integrated circuits, using photolithographic masks. More particularly, the present invention relates to the application of phase shift masking to complex layouts for integrated circuits and similar objects.

2. Description of Related Art

Phase shift masking has been applied to create small dimension features in integrated circuits. Typically the features have been limited to selected elements of the design, which have a small, critical dimension. See, for example, U.S. Pat. No. 5,766,806.

Although manufacturing of small dimension features in integrated circuits has resulted in improved speed and performance, it is desirable to apply phase shift masking more extensively in the manufacturing of such devices. However, the extension of phase shift masking to more complex designs results in a large increase in the complexity of the mask layout problem. For example, when laying out phase shift windows on dense designs, phase conflicts will occur. One type of phase conflict is a location in the layout at which two phase shift windows having the same phase are laid out in proximity to a feature to be exposed by the masks, such as by overlapping of the phase shift windows intended for implementation of adjacent lines in the exposure pattern. If the phase shift windows have the same phase, then they do not result in the optical interference necessary to create the desired feature. Thus, it is necessary to prevent inadvertent layout of phase shift windows in phase conflict near features to be formed in the layer defined by the mask.

In the design of a single integrated circuit, millions of features may be laid out. The burden on data processing resources for iterative operations over such large numbers of features can be huge, and in some cases makes the iterative operation impractical. The layout of phase shift windows and the assignment phase shift values to such windows, for circuits in which a significant amount of the layout is accomplished by phase shifting, is one such iterative operation which has been impractical using prior art techniques.

Another problem that is associated with the use of phase shift masking arises from the need for two different mask patterns for implementation of a layer of material having small dimension features. Existing systems expose the wafer using a binary mask pattern using a stepper having optical settings optimized for the binary mask pattern, and expose the wafer using the phase shift mask pattern using a stepper having optical settings optimized for the phase shift mask pattern. Typically, the optical settings are quite different. For example, a phase shift pattern is usually exposed using a highly coherent radiation source. However, binary masks achieve better results having less coherent radiation sources. Thus, between the two exposures, the wafer is required to sit while the settings and masks are changed within the stepper. During the time the wafer sits, the quality of the resist can degrade. Furthermore, the time involved in moving the wafer and adjusting a stepper slow down the manufacturing process. For background concerning optical lithography and the phase shift masking, see Wong, RESOLUTION ENHANCEMENT TECHNIQUES IN OPTICAL LITHOGRAPHY, SPIE Press, Bellingham, Wash. (2001).

It is useful to understand the common stepper settings and parameters used in so called "gate shrink" phase shifting designs. A "gate shrink" design, or mask, is simply a layout, or mask, where significant portions of a pattern, usually field polysilicon, must still print properly using the corresponding binary trim mask, while portions such as transistor gates are formed using phase shifting, resulting in so-called "shrunk" gates.

Generally, phase shifting masks require a low partial coherence a arrangement in the stepper, so that the light exposing the wafer is highly coherent.

In contrast, when working with a binary pattern on a mask that has densely packed and small features, high partial coherence a stepper settings producing less coherent light, and/or off-axis-illumination (OAI), or other illumination configurations are employed.

For that reason, the binary trim pattern on a mask for a gate shrink-type design would commonly be exposed using low coherency (high σ) or off-axis illumination. But, the phase shifting pattern on a mask for such a gate shrink-type design would use high coherency (low σ) illumination. This requires an adjustment of the projection system in the stepper, typically a change in size of an aperture, between the phase shifting pattern and trim pattern exposures.

Because of these and other complexities, implementation of a phase shift masking technology for complex designs will require improvements in the approach to the design of phase shift masks.

SUMMARY OF THE INVENTION

Mask and integrated circuit fabrication approaches are described to facilitate use of so called "full phase shift" masks, where substantially all of a layout is defined using phase shifting. Definitions of other patterns, layouts, and mask types for which the invention is suitable are described below.

For the masks used by embodiments of the invention, the optical settings of a stepper are maintained constant, except for dosing in some embodiments, between exposure with the phase shifting pattern and the binary trim pattern. Optical settings that are not changed between the exposures of the phase shifting and trim patterns include one or more members of a set of optical parameters including numerical aperture (N.A.), wavelength (λ) of light, coherency (such as measured by partial coherence σ), illumination configuration (single spot source, dipole source, quadrapole source, annular source), axis of illumination, and defocus, in various combinations.

In various embodiments, the relative dosing between the exposure of the phase shifting pattern and the trim pattern is expressed by a ratio 1.0:r, where r>0.0. In some embodiments, 2.0<r<4.0, so that the exposure dosing of the binary pattern is from 2 to 4 times greater than the dosing of the phase shifting pattern. One embodiment uses a 1:2 ratio, another a 1:3 ratio. The greater exposure of the trim pattern facilitates clearing of cuts, or openings, while preventing exposure of the features defined by the phase shifting pattern. In some embodiments, r is determined from simulation results for a particular optical lithography model, e.g. stepper, wavelength, resist measurements, etc.

Additionally, both patterns are provided on a single reticle in one embodiment of the present invention. A single reticle with multiple patterns can increase mask manufacturing costs. However, the cost of the mask is justified because the use of the single reticle can improve yield, and save manufacturing steps and time. A multiple pattern reticle can allow more rapid exposure of the layer of material using both the phase shifting pattern and the trim pattern. The layout of patterns on the single reticle can be simple (one of each) or more complex (multiple phase patterns; multiple binary patterns; one-dimensional; two-dimensional; etc.) The dosing ratio r for a layer to be exposed can be implemented, for example using constant exposure doses to each pattern with the ratio of the number of phase shifting patterns and to the number of trim patterns on the mask set equal to the dosage ratio 1.0:r. In this example, the exposure dosage is another parameter that is not changed between exposures of the phase shift and trim patterns.

A method for manufacturing an integrated circuit is provided according to the present invention, which includes forming a layer of resist on a semiconductor wafer, moving the wafer to a stepper system including a radiation source and a reticle having a phase shifting pattern and a trim pattern; positioning the wafer and the reticle for exposure of a phase shifting pattern in the reticle; applying a dose of radiation to the wafer through the phase shifting pattern using stepper settings including a set of optical parameters including numerical aperture (N.A.), wavelength ($\lambda$) of light, coherency (such as measured by partial coherence $\sigma$), illumination configuration (single spot source, dipole source, quadrapole source, annular source), axis of illumination, and defocus; positioning the wafer and the reticle for exposure of a trim pattern in the reticle; applying a dose of radiation to the wafer through the trim pattern using stepper settings including said set of parameters for the trim exposure, wherein all or some of the members of said set of parameters are substantially the same as those used for the phase shifting exposure. The phase shifting and trim patterns may be exposed in any order that results in the die on the wafer being exposed using both, and receiving proper dosages of radiation for the phase shifting and trim patterns. After exposing both patterns, the wafer is removed from the stepper, and available for subsequent steps to complete the integrated circuit. Then, the stepper is available for a next wafer in the line.

In one embodiment, all of said stepper settings are the same, in the sense that the stepper settings are not altered, or in other embodiments, settings of parameters that involve changing or moving an optical device such as an aperture stop setting or a lens position are not changed, between the phase shifting and trim exposures. In some embodiments, one reticle carries the phase shifting pattern and another carries the trim pattern, and the steps of positioning the reticle and the wafer include selecting the appropriate reticle.

In one embodiment, after exposing both patterns, the photoresist is developed, and the resulting pattern of developed photoresist is used for formation of a layer of polysilicon on the wafer, including elements of circuits being formed thereon. Such elements include transistor gates, interconnect structures, and the like.

Resulting ICs produced according to embodiments of the invention can include a large number of subwavelength features due to the use of phase shifting and those features will tend to be extremely well defined because of the high quality energy profile achieved, and the ability to rapidly develop the photoresist by using embodiments of the invention (shorter and more uniform time intervals between exposures; fewer mistakes in lithography settings, fewer mistakes in optical settings; etc.)

BRIEF DESCRIPTION OF THE FIGURES

The file of this patent contains at least one drawing executed in color. Copies of this patent with color drawing(s) will be provided by the Patent and Trademark Office upon request and payment of the necessary fee.

DETAILED DESCRIPTION

Overview

Figure 1:
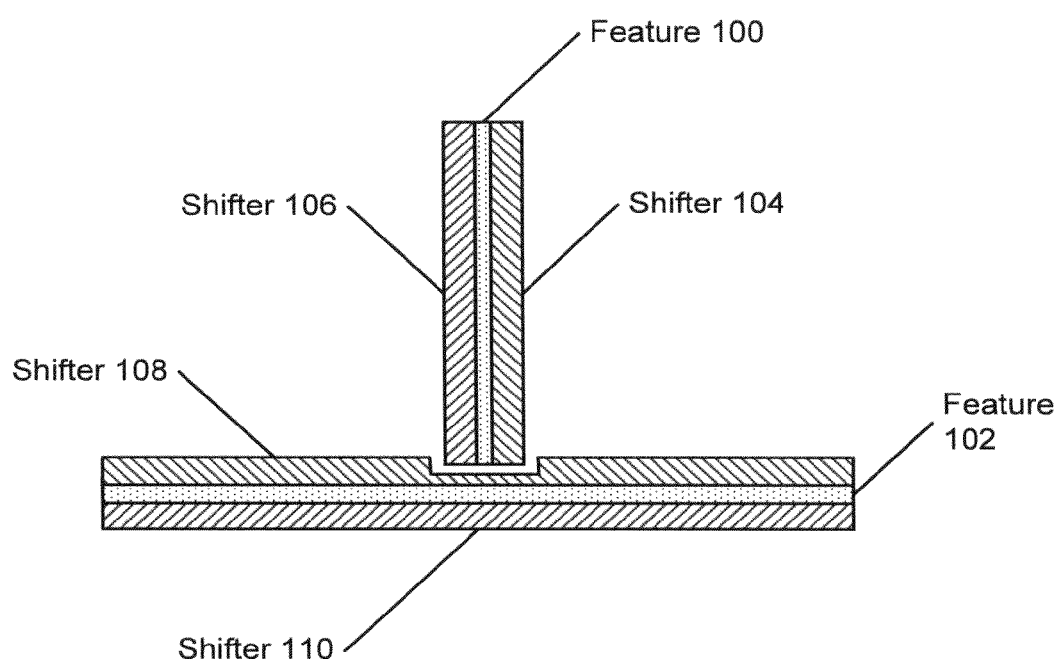
FIG. 1 illustrates a pattern of features and phase shift regions for defining those features.

First, exposure settings for use in conjunction with phase shifting masks that produce substantial portions of a pattern of a layer on an integrated circuit (IC) using phase shifting will be considered. Next, relative dosing considerations between the phase shifting pattern exposure and the binary, trim pattern exposure will be considered. Finally, approaches for using a single reticle in the production of ICs using phase shifting will be considered. (As used herein, the terms "mask" and "reticle" are synonyms, generally referring to a device carrying patterns, also called layouts, for photolithographic exposure used in manufacture of semiconductor wafers or other workpieces.)

Exposure Settings

In one embodiment of the invention, an optical lithography exposure system, generally referred to as a stepper, has a setting of members of a set of one or more optical parameters that control characteristics of exposures, the settings used to expose the phase shifting pattern and the complementary trim pattern used to produce an IC using phase shifting are unchanged, or otherwise kept substantially the same, between the exposures. This is applied for example when all, or substantially all portions, of a pattern are being defined using a phase shifting pattern on a mask, because there is minimal need to print small features using the trim pattern. Thus the trim pattern consists of features that have greater design latitude in exposure settings than do the features formed using the phase shifting pattern, and can be exposed with key optical settings such as one or more members of a set of optical parameters including numerical aperture (N.A.), wavelength (λ) of light, coherency (such as measured by partial coherence σ), illumination configuration (single spot source, dipole source, quadrapole source, annular source), axis of illumination, and defocus, in various combinations.

Masks having a phase shift pattern that results in all, or substantially all portions, of a pattern on the layer of material being exposed being defined using the phase shifting pattern, are sometimes referred to as "full phase" masks. In one embodiment, the masks are defined according to the process described in U.S. patent application Ser. No. 09/932,239 filed 16 Aug. 2001, now U.S. Pat. No. 7,083,879 issued 1 Aug. 2006, entitled "Phase Conflict Resolution for Photolithographic Masks" having inventors Christophe Pierrat and Michel Côté; and assigned to the assignee of the present invention, which is incorporated herein by reference as if fully set forth herein.

In another embodiment, a phase shifting mask that produces substantial portions of a pattern of an IC using phase shifting comprises a phase shifting pattern on the mask where substantially all features for a particular layer are defined using phase shifting. In another embodiment, a phase shifting mask that produces substantial portions of a pattern of an IC using phase shifting comprises a pattern on a mask such that only features that are non-critical for the binary exposure are non-phase shifted. In such an embodiment, a non-critical feature is a feature where there is greater latitude in critical dimension control such that when the non-critical feature is exposed according to the conditions more fully described below the resulting critical dimension variances are acceptable.

In other embodiments, the relevant layout comprises a layout where phase shifting is used to define at least one of:
- eighty percent (80%) of non-memory portions in one layer of material in the layout;
- eighty percent (80%) of a part of the floorplan in one layer of material;
- eighty percent (80%) of cells in a given area;
- ninety percent (90%) of a layer of material;
- ninety five percent (95%) of a layer of material;
- ninety nine percent (99%) of a layer of material;
- one hundred percent (100%) of a layer of material;
- one hundred percent (100%) of a functional unit of the chip (e.g. ALU) in one layer of material;
- one hundred percent (100%) of features in a layer of material that are in the critical path of the design;
- one hundred percent (100%) of features in a layer of material above or below certain dimensions, e.g. all features with a critical dimension 50 μm<CD<100 μm;
- everything in a layer of material except those features that cannot be phase shifted due to phase conflicts that cannot be resolved;
- everything in a layer of material except test structures; and
- one hundred percent (100%) of all non-dummy features, e.g. features providing structural support for processing purposes, and non-electrically functional features in a layer of material.

By maintaining a high coherency illumination setting (low partial coherence a) for both the phase shifting and binary trim pattern on a mask, it is possible to more quickly, and accurately, produce ICs where all or substantially all of the pattern features are defined using phase shifting. In one embodiment, the percentages are determined based on the number of edges, or edge segments, within the pattern defined using phase shifting.

In one embodiment, one or more of the numerical aperture (NA) of the radiation exposing the wafer, the coherency setting (σ), the illumination configuration (on/off axis, dipole, quadrapole, annular, etc.), and defocus are kept unchanged between the phase shifting and trim exposures. In one embodiment, all optical settings that require mechanical adjustment of items in the optical path to change, such as an aperture stop setting, or a lens position, are left unchanged between the phase shifting and trim pattern exposures.

In one embodiment, keeping the stepper settings unchanged facilitates the use of the single reticle approach described below. In another embodiment, keeping the stepper settings unchanged facilitates the use of a single stepper for exposure of both the phase shifting pattern and the corresponding trim pattern, whether such patterns are on the same mask or on separate masks.

Dosing

Turning to FIG. 1, a pattern of features and phase shift regions for defining those features is shown. The phase shifting design shown in FIG. 1 was manually defined. The pattern includes the feature 100 and the feature 102. Of interest is the proximity of the end cap of the feature 100 with the top edge of the feature 102. The phase shift regions have been defined with the shifter 104, the shifter 106, the shifter 108, and the shifter 110. Here, the shifter 106 and the shifter 110 share a single phase, e.g. 0, as do the shifter 104 and the shifter 108, e.g. π.

Figure 2:
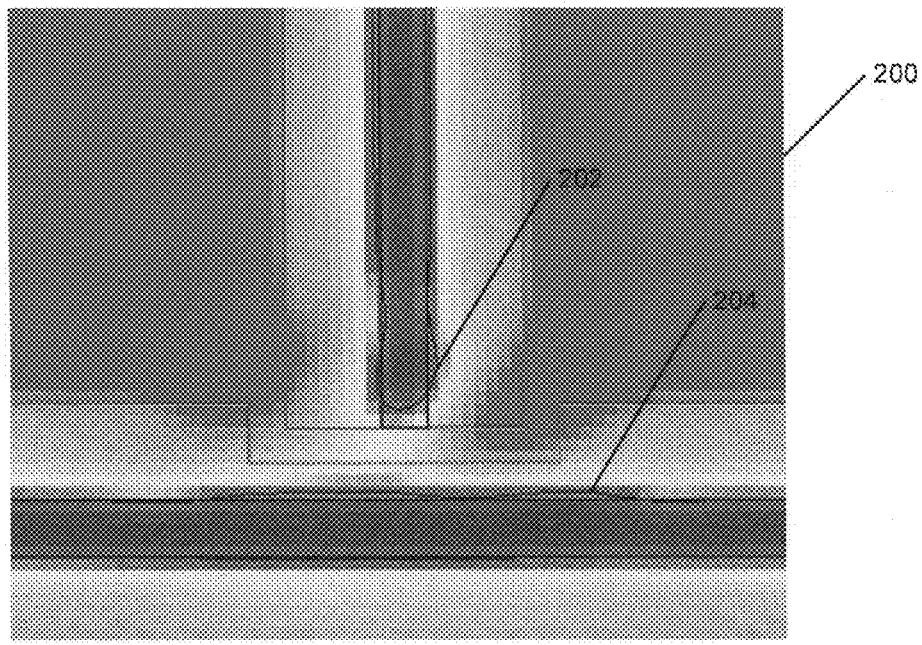
FIG. 2 illustrates a simulated exposure of the layout of FIG. 1 according to a 1:2 dosage ratio between the phase shifting mask and the trim mask.
Figure 3:
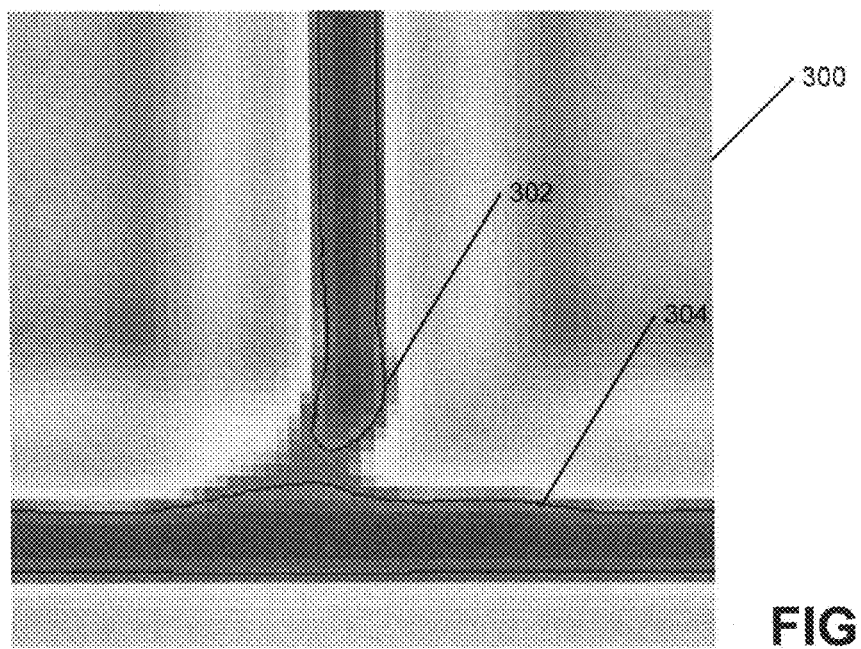
FIG. 3 illustrates a simulated exposure of the layout of FIG. 1 according to a 1:1 dosage ration between the phase shifting mask and the trim mask.

Turning to FIG. 2 and FIG. 3, simulation results for the pattern of FIG. 1 are shown with stepper settings maintained constant, but the relative dosing between pattern exposures changed. FIG. 2 shows a simulation output 200 where the relative dosing between the phase shift pattern and the corresponding trim pattern was 1:2 (r=2). FIG. 3 shows a simulation output 300 where the relative dosing was 1:1 (r=1).

Looking more closely at the simulation output 200 and the simulation output 300, the outputs include black contour lines (contour line 202, contour line 204, contour line 302, and contour line 304) that indicate where the feature 100 and the feature 102 will print. As can be seen from the figure, with a 1:1 ratio, FIG. 3, the end cap of the feature 100 and the edge of the feature 102 come extremely close. In contrast, with a 1:2 ratio, FIG. 2, the end cap and edge are better defined, and therefore less likely to improperly print as a single connected feature.

More generally, higher values of r in the ratio 1.0:r, where r>1.0 are useful in printing ICs when phase shifting masks of the type discussed here are used. In one embodiment, 2.0<r<4.0. In another embodiment, a 1:3 ratio is used. Most generally, r can have a real numbered value as the stepper/scanner exposure setting will be set in an absolute number of millijoules per square centimeter per exposure, e.g. 10 mJ/cm² and 2 mJ/cm², etc.

In some embodiments, one or more simulations are performed using the actual and/or test layouts to select r for a particular optical/stepper model. However, the selected ratio reflects a balance between "hard" or over exposure for cut regions (necessary and desirable) versus exposure of areas under the trim (undesirable).

Single Reticle

Figure 4:
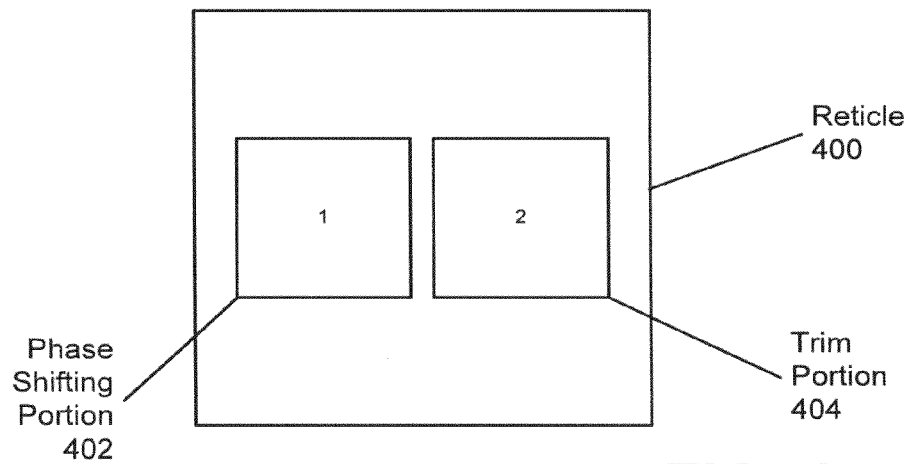
FIG. 4 illustrates a single reticle having both a phase shifting and trim patterns.

FIG. 4 illustrates a single reticle having both a phase shifting and trim patterns. In this example, the reticle 400 includes a phase shifting pattern 402 and a trim pattern 404. The phase shifting pattern 402 shows a pattern "1" and the trim pattern 404 a pattern "2" for convenience of explanation of the wafer exposures described below.

The phase shifting pattern 402 and the trim pattern 404 are separated by a small gap. In some embodiments, the gap is dependent on the blading capabilities and accuracy for the stepper. In one embodiment, the separation is 5 mm.

A given stepper/scanner system will have a usable area of a mask, e.g. an n by m millimeter field. Thus, the number of mask patterns that can be accommodated on a single reticle will depend on the size of the design and the usable reticle area.

Figure 5:
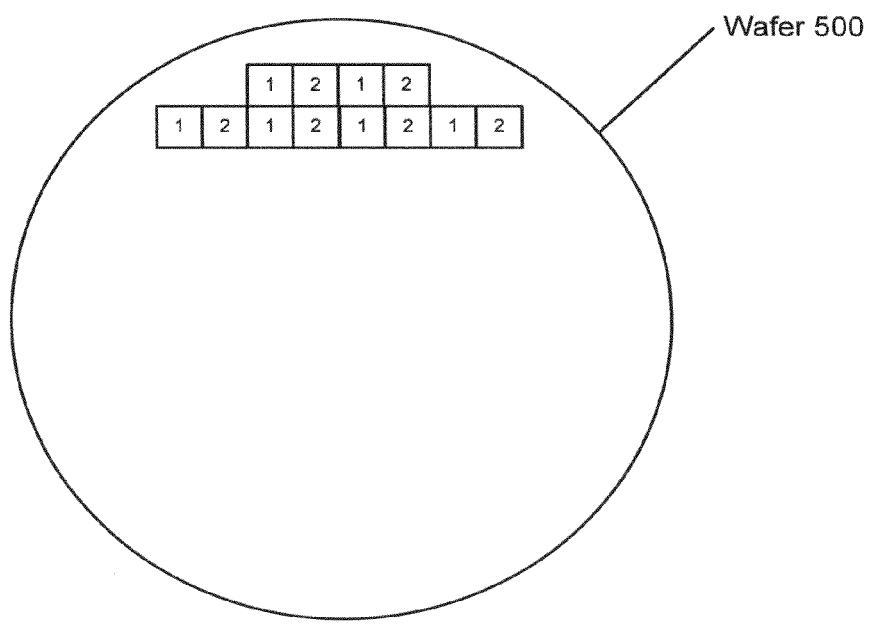
FIG. 5 illustrates a portion of a wafer after a first exposure by the reticle of FIG. 4.
Figure 6:
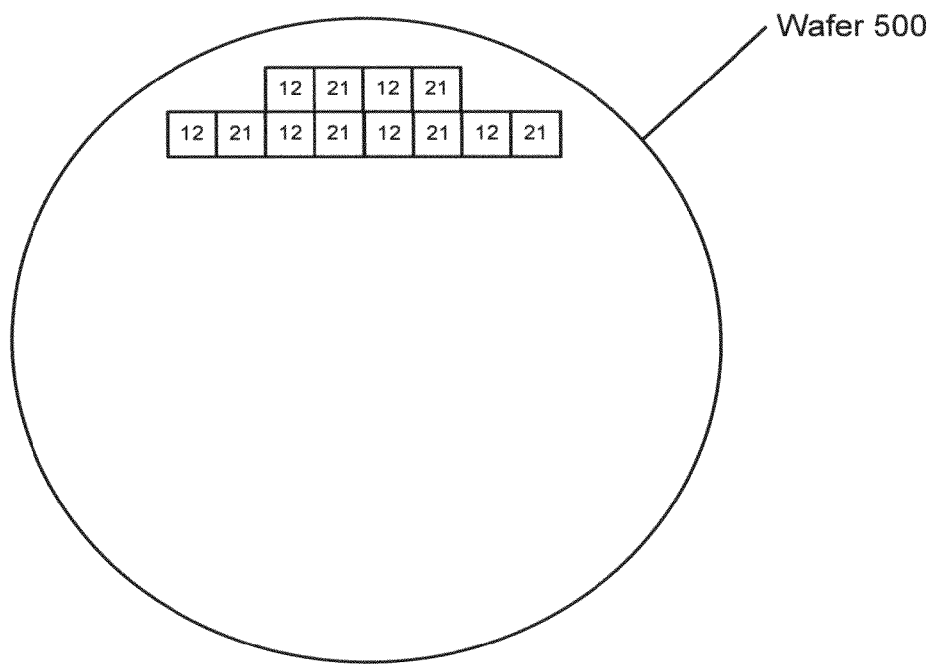
FIG. 6 illustrates the wafer of FIG. 5 after a second exposure by the reticle of FIG. 4.

In one approach, the dosing will be maintained at equal levels for the phase shifting and trim and binary exposures. Turning to FIG. 5, a wafer 500 is shown after the first exposure. The wafer 500 has the alternating 1-2 pattern caused by the exposure of some regions to the phase shifting pattern and the exposure of other regions to the trim pattern 404. A second exposure, shown in FIG. 6, of the wafer 500 completes the process once the reticle and/or wafer has been repositioned within the stepper. FIG. 6 illustrates the pattern as 12 or 21 depending on the order of exposure for a region.

Figure 7:
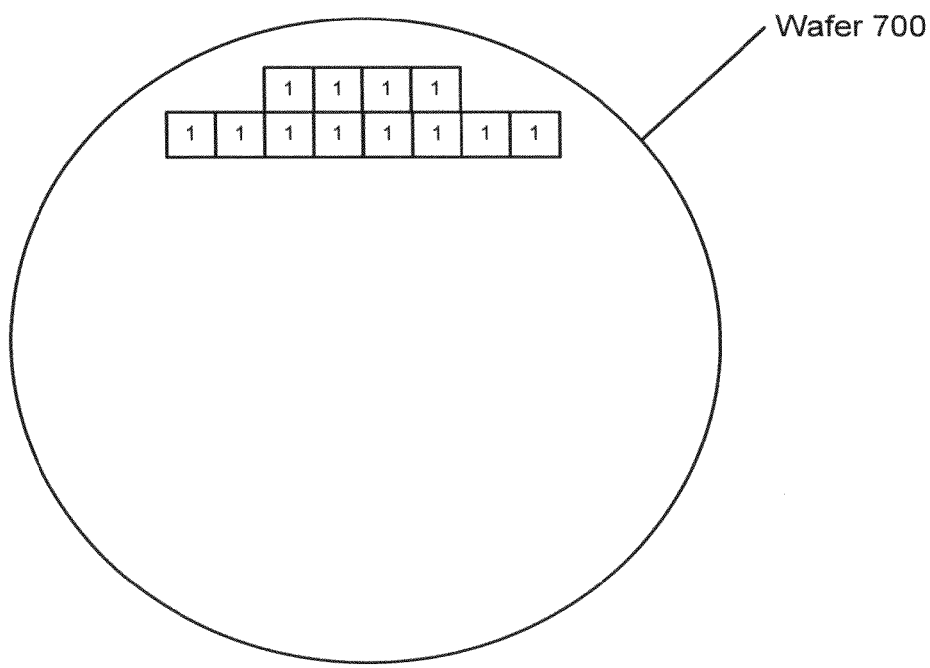
FIG. 7 illustrates a portion of a wafer after a first exposure by the reticle of FIG. 4 with blading.
Figure 8:
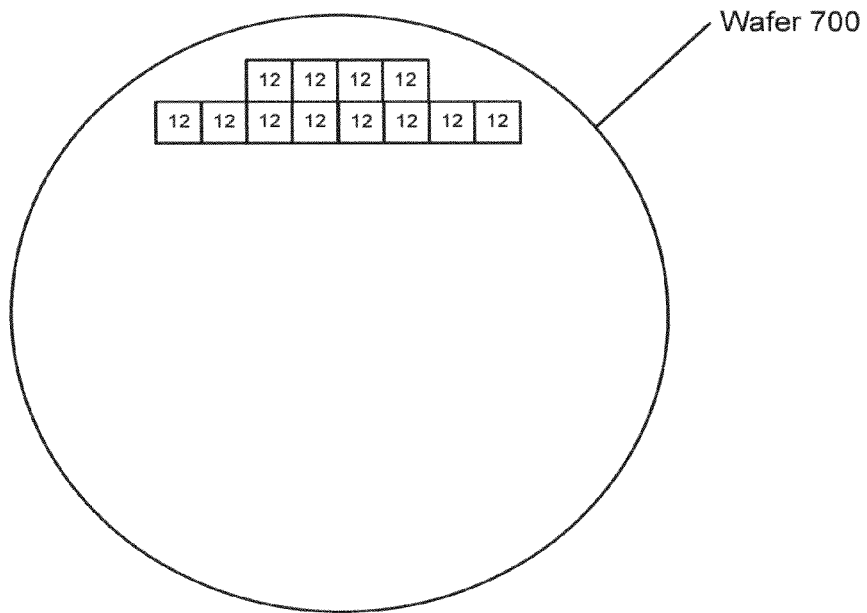
FIG. 8 illustrates the wafer of FIG. 7 after a second exposure by the reticle of FIG. 4 with blading.

In another approach, dosing can be at a user selected ratio, e.g. 1.0:r, between patterns through the use of blading. By blading, or covering, one region of the reticle 400, an exposure of the type shown in FIG. 7 on a wafer 700 will result after all of the fields on the wafer are exposed. A second exposure after repositioning the reticle and/or wafer in the stepper is shown in FIG. 8 where the exposure with the phase shifting pattern 402 is complete. The blades could then be adjusted to cover the other patterns of the reticle and allow exposures to be made with the trim pattern 404 exposing the wafer.

Figure 9:
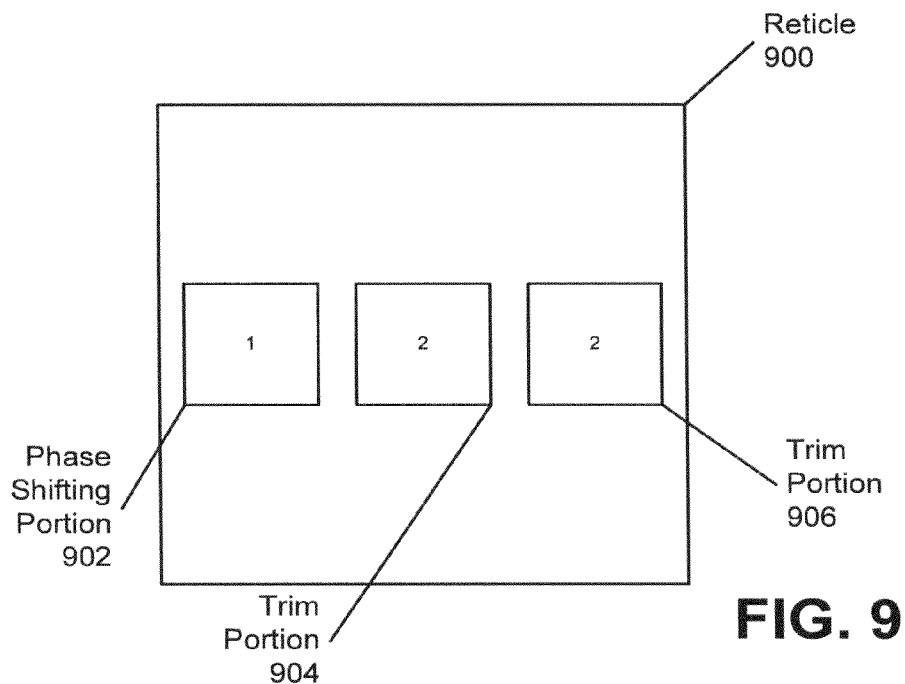
FIG. 9 illustrates a single reticle having phase shifting pattern and two trim patterns.
Figure 10:
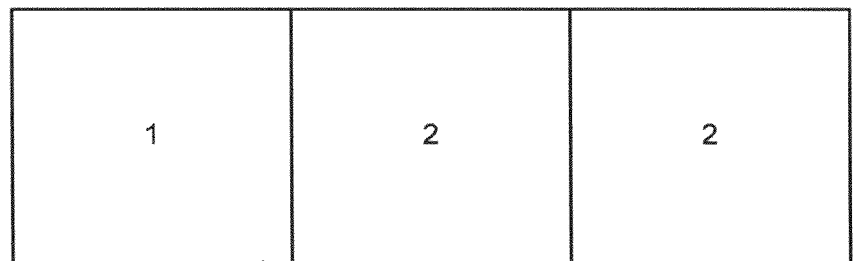
FIG. 10 illustrates a portion of a wafer after a first exposure by the reticle of FIG. 9.
Figure 11:
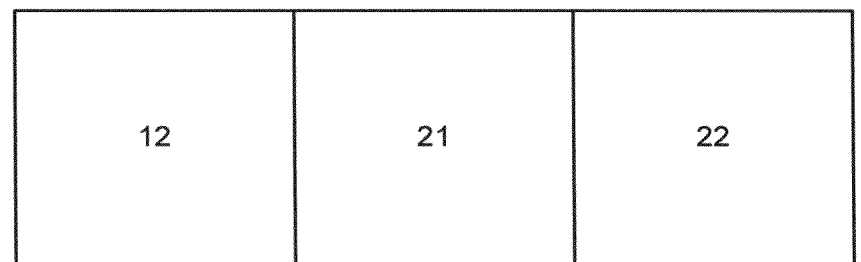
FIG. 11 illustrates a portion of a wafer after a second exposure by the reticle of FIG. 9.
Figure 12:
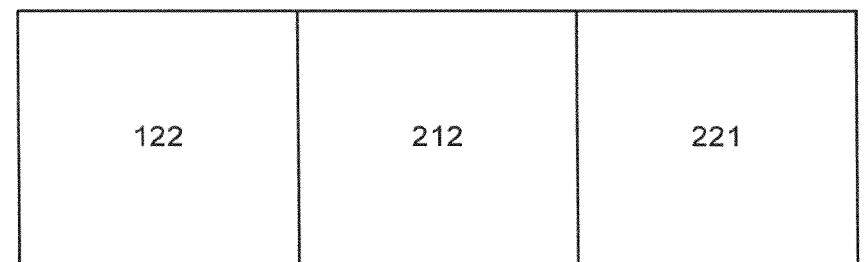
FIG. 12 illustrates a portion of a wafer after a third exposure by the reticle of FIG. 9.

FIG. 9 illustrates a single reticle having phase shifting pattern and two trim patterns. In this example, the reticle 900 includes a phase shifting pattern 902, a trim pattern 904 and a trim pattern 906. In this embodiment, the trim pattern 904 and the trim pattern 906 are designed to produce the same pattern. Accordingly, by triple exposing the wafer a 1:2 dosing ratio between the phase shifting pattern and the trim patterns can be accomplished. The results are depicted in FIGS. 10-12 showing a portion of the wafer after the first exposure 1000, after the second exposure 1100, and after the third exposure 1200, respectively.

More complex reticle patterns are possible. For example, two phase shifting patterns could be used, e.g. with one phase shifting pattern having structures in one orientation and another pattern with structures in another orientation. In other embodiments, a two-dimensional pattern of the mask patterns on the reticle is used.

The present invention also provides a method for manufacturing an integrated circuit. The method includes forming a layer of resist on a wafer at a first process station. The resist is cured and prepared for exposure using a stepper or scanner. The wafer with a layer of resist is transported to the stepper. The stepper includes a radiation source, a mask and an optical path for exposing the wafer to radiation. The optical path is characterized by a set of optical parameters including one or more of a wavelength $\lambda$ of illumination, numerical aperture NA, coherency, illumination configuration and defocus. In the stepper, the layer of resist is exposed to a first dosing radiation to a phase shifting pattern in said mask using a first setting of the set of optical parameters. Next, the layer of resist is exposed to a second dose of radiation through the trim pattern in said mask using said first setting. Thus, the setting of the optical parameters is not changed between the exposures of the phase shift pattern and the trim pattern. As mentioned above, the mask may have more than one trim pattern and more than one phase shift pattern implemented thereon. In this case, the wafer may be subject to additional exposure steps, in which the settings of the optical parameters are not changed. The order of exposure of the phase shift pattern or patterns and trim pattern or patterns can be changed as suits a particular processing situation.

As can be seen, according to this process both the phase shift and trim exposures are carried out in the same stepper, using the same settings. Thus, the wafer does not wait for changing of optical parameters, or to be moved from one stepper to the next, between exposures. This reduces the possibility for error in manufacturing of the device, and reduces the time required to complete the exposure step.

After the exposure, the resist is developed using the techniques that are adapted for use with a particular resist involved. A pattern is left on the wafer which is used for a deposition and/or etching step to form features of an integrated circuit. For example, the pattern may be used for etching an underlying layer of polysilicon to form interconnect, gate, capacitor, resistor and other circuit features on an integrated circuit.

Process Advantages

Maintaining the stepper settings as a constant can significantly improve throughput as well as lead to better critical dimension uniformity. Accordingly, if too much time passes between the first exposure and the second exposure and/or the amount of time is not maintained constant the results may be poorer than expected.

More specifically, current generation photoresist materials are chemically amplified so that exposure to light produces a very small number of acid molecules, that then continue to react. The passage of time and exposure to air may cause carbon dioxide, and other chemicals, to take up the acid and neutralize it. Using the single reticle approach, the photoresist should maintain its properties throughout both exposures and the timing between exposures can be shorter allowing more closely controlled effects of exposure. Additionally, over time, the acid diffuses into the polymer.

The better effects from different dosing can be implemented while maintaining other stepper settings constant.

The increased throughput and yield possible should readily make up for the increase in reticle costs; although, the cost should be comparable, or less than, the cost of a dual reticle approach using separate masks for phase shifting and binary patterns.

REPRESENTATIVE ALTERNATIVE EMBODIMENTS

Additionally, although the description has primarily focused on examples of defining a polysilicon, or "poly", layer within an IC, phase shifting can be used to define other layers of material.

Some embodiments of the invention include computer programs for simulating stepper exposures using phase shift and trim patterns to compute appropriate relative dosing between phase and trim/binary exposures. In one embodiment, the ICWorkbench™ software produced by Numerical Technologies, Inc., San Jose, Calif. is used to simulate the exposure conditions, e.g. as seen in FIGS. 2-3. In other embodiments, computer programs are used to develop a pattern of layouts on a single reticle and a corresponding exposure pattern for exposure of wafers by the reticle.

As used herein, the term optical lithography refers to processes that include the use of visible, ultraviolet, deep ultraviolet, extreme ultraviolet, x-ray, and other radiation sources for lithography purposes.

CONCLUSION

The foregoing description of embodiments of the invention has been provided for the purposes of illustration and description. It is not intended to be exhaustive or to limit the invention to the precise form disclosed. Many modifications and variations will be apparent. The embodiments were chosen and described in order to best explain the principles of the invention and its practical application, thereby enabling others to understand the invention for various embodiments and with various modifications as are suited to the particular use contemplated. It is intended that the scope of the invention be defined by the following claims.

We claim:

1. A method of manufacturing an integrated circuit (IC) product comprising:
    exposing a pattern in at least one layer of material in the IC using at least two mask patterns, the first mask pattern comprising a phase shifting pattern and the second mask pattern comprising a trim pattern, the phase shifting pattern defining substantially all of the pattern of the layer of material and the trim pattern protecting the pattern defined using the phase shifting pattern and clearing phase shifting artifacts;
    said exposing using an optical lithography exposure system having a setting of values of changeable optical parameters that control characteristics of exposures, to the first mask pattern and the second mask pattern, where said setting of values is substantially the same while exposing the first and second mask patterns, and setting of values is optimized for the first mask pattern comprising the phase shifting pattern instead of the second mask pattern comprising the trim pattern.

2. The method of manufacturing an IC product of claim 1, wherein the first mask pattern comprises a "full phase" mask.

3. The method of manufacturing an IC product of claim 1, wherein the pattern on the layer of material can be characterized by having at least ninety-five percent (95%) of the pattern defined by the phase shifting pattern.

4. The method of manufacturing an IC product of claim 1, wherein the optical lithography exposure system comprises at least one of a stepper and a scanner.

5. The method of manufacturing an IC product of claim 1, wherein said changeable optical parameters consist of numerical aperture (N.A.), wavelength ($\lambda$) of radiation, partial coherency ($\sigma$), illumination configuration, and defocus.

6. The method of manufacturing an IC product of claim 1, wherein said optical parameters comprise two or more of numerical aperture (N.A.), wavelength ($\lambda$) of radiation, partial coherency ($\sigma$), illumination configuration, and defocus.

7. The method of manufacturing an IC product of claim 1, wherein substantially the same comprises within plus or minus 10%.

8. The method of manufacturing an IC product of claim 1, wherein the exposing further comprises using a first dosing for the first mask pattern and a second dosing for the second mask pattern, the first dosing and the second dosing being in a ratio of 1.0 to r, r>0.0.

9. The method of manufacturing an IC product of claim 1, wherein the first mask pattern and the second mask pattern are on a single reticle.

10. The method of manufacturing an IC product of claim 9, and wherein the exposing further comprises blading the first mask pattern and the second mask pattern on the reticle during the exposing to permit different dosing.

11. A method for manufacturing an integrated circuit, comprising:
    forming a layer of resist on a wafer;
    exposing the layer to a first dose of radiation through a phase shifting pattern in a first mask, the first dose of radiation characterized by first changeable parameters having values optimized for the phase shifting pattern instead of a trim pattern; and
    exposing the layer to a second dose of radiation through the trim pattern in a second mask protecting a pattern defined using the phase shifting pattern and clearing phase shifting artifacts, the second dose of radiation characterized by second changeable parameters having substantially the same values as the first changeable parameters selected for exposure of the phase shifting pattern with the first dose of radiation, and said values of changeable parameters for the second dose are optimized for the phase shifting pattern instead of the trim pattern, wherein substantially the same values comprises values within plus or minus 10%.

12. The method of claim 11, wherein said parameters include a parameter indicating partial coherence $\sigma$ of the first and second doses of radiation at the layer.

13. The method of claim 11, wherein said parameters include a parameter indicating a numerical aperture NA of the first and second doses of radiation at the layer.

14. The method of claim 11, wherein said parameters include a parameter indicating an axis of propagation of the first and second doses of radiation at the layer.

15. The method of claim 11, wherein said parameters include a parameter indicating an illumination configuration of the first and second doses of radiation.

16. The method of claim 11, wherein said parameters include a parameter indicating defocus of the first and second doses of radiation at the layer.

17. The method of claim 11, wherein said parameters include parameters indicating numerical aperture NA of the first and second doses of radiation at the layer, partial coherence $\sigma$ of the first and second doses of radiation at the layer, an axis of propagation of the first and second doses of radiation at the layer, an illumination configuration of the first and second doses of radiation, at the layer and defocus of the first and second doses of radiation at the layer.

18. The method of claim 11, wherein said first dose and said second dose are different.

19. The method of claim 11, wherein said phase shifting pattern and said trim pattern are on a single mask.

20. The method of claim 11, wherein a pattern is exposed on the layer which can be characterized by one or more of the following: at least eighty percent (80%) of the portions of the pattern that do not form memory devices are defined by the phase shifting pattern; at least eighty percent (80%) of a floorplan in the pattern is defined by the phase shifting pattern; at least ninety percent (90%) of the pattern is defined by the phase shifting pattern; all features in the pattern except those features that are not phase shifted due to phase conflicts are defined by the phase shifting pattern; all features in the pattern that are not test structures are defined by the phase shifting pattern; and all features in the pattern that are not dummy structures are defined by the phase shifting pattern.

21. The method of claim 11, wherein a pattern is exposed on the layer which can be characterized by having at least ninety-five percent (95%) of the pattern defined by the phase shifting pattern.

22. The method of claim 11, wherein said parameters comprise parameters that are changed by a mechanical adjustment of an optical element.

23. A method for manufacturing an integrated circuit, comprising:

forming a layer of resist on a wafer in a first process station;

moving the wafer to a second process station including a radiation source, a mask and an optical path for exposing the wafer to radiation, the optical path being characterized by optical parameters;

exposing, in the second process station, the layer to a first dose of radiation through a phase shifting pattern in said mask using a first setting of changeable values for the optical parameters, and said first setting of changeable values is optimized for the phase shifting pattern instead of a trim pattern; and exposing, in the second process station, the layer to a second dose of radiation through the trim pattern in said mask using said first setting of changeable values, optimized for the phase shifting pattern instead of the trim pattern, said trim pattern protecting a pattern defined using the phase shifting pattern and clearing phase shifting artifacts.

24. The method of claim 23, wherein said optical parameters include numerical aperture and partial coherence $\sigma$.

25. The method of claim 23, wherein said optical parameters include numerical aperture NA, partial coherence $\sigma$, illumination configuration, and defocus.

26. The method of claim 23, wherein said optical parameters include partial coherence $\sigma$.

27. The method of claim 23, wherein said first dose and said second dose have different dosage levels.

28. The method of claim 23, wherein a pattern is exposed on the layer which can be characterized by one or more of the following: at least eighty percent (80%) of the portions of the pattern that do not form memory devices are defined by the phase shifting pattern; at least eighty percent (80%) of a floorplan in the pattern is defined by the phase shifting pattern; at least ninety percent (90%) of the pattern is defined by the phase shifting pattern; all features in the pattern except those features that are not phase shifted due to phase conflicts are defined by the phase shifting pattern; all features in the pattern that are not test structures are defined by the phase shifting pattern; and all features in the pattern that are not dummy structures are defined by the phase shifting pattern.

29. The method of claim 23, wherein a pattern is exposed on the layer which can be characterized by having at least ninety-five percent (95%) of the pattern defined by the phase shifting pattern.

30. The method of claim 23, wherein said optical parameters comprise parameters that are changed by a mechanical adjustment of an optical element.

\* \* \* \* \*

UNITED STATES PATENT AND TRADEMARK OFFICE
CERTIFICATE OF CORRECTION

PATENT NO. : 7,629,109 B2  
APPLICATION NO. : 12/080886  
DATED : December 8, 2009  
INVENTOR(S) : Christophe Pierrat et al.

It is certified that error appears in the above-identified patent and that said Letters Patent is hereby corrected as shown below:

In claim 1, column 9, line 47, before the word "setting" insert the word -- said --.
In claim 12, column 10, line 37, after the word "coherence", delete "a" and insert -- σ --.

Signed and Sealed this

Thirteenth Day of April, 2010

David J. Kappos
*Director of the United States Patent and Trademark Office*